United States Patent [19]

Osada et al.

[11] Patent Number: 5,624,720
[45] Date of Patent: Apr. 29, 1997

[54] PROCESS FOR FORMING A DEPOSITED FILM BY REACTING BETWEEN A GASEOUS STARTING MATERIAL AND AN OXIDIZING AGENT

[75] Inventors: Yoshiyuki Osada, Atsugi; Jun-Ichi Hanna, Yokohama, both of Japan

[73] Assignee: Canon Kabushiki Kaisha, Tokyo, Japan

[21] Appl. No.: 308,544

[22] Filed: Sep. 21, 1994

Related U.S. Application Data

[63] Continuation of Ser. No. 94,358, Jul. 21, 1993, abandoned, which is a continuation of Ser. No. 837,685, Feb. 19, 1992, abandoned, which is a continuation of Ser. No. 501,500, Mar. 30, 1990, abandoned.

[30] Foreign Application Priority Data

Mar. 31, 1989 [JP] Japan ................ 1-081105

[51] Int. Cl.⁶ .............. C23C 16/48; C23C 8/00; C23C 16/00
[52] U.S. Cl. ............ 427/583; 427/582; 427/586; 427/255.1; 427/255.2; 117/89; 117/92; 117/93
[58] Field of Search ............... 427/582, 583, 427/584, 586, 255.1, 255.2, 255.3, 457, 568, 587, 588, 585; 216/37, 66; 117/89, 92, 93; 156/643.1

[56] References Cited

U.S. PATENT DOCUMENTS

| | | | |
|---|---|---|---|
| 3,661,637 | 5/1972 | Sirtl | 427/53.1 |
| 4,497,683 | 2/1985 | Celler et al. | 427/53.1 |
| 4,579,750 | 4/1986 | Bowen et al. | 427/53.1 |
| 4,655,849 | 4/1987 | Schachameyer et al. | 427/53.1 |
| 4,657,777 | 4/1987 | Hirooka et al. | 427/39 |
| 4,683,144 | 7/1987 | Nishimura et al. | 427/35 |
| 4,812,328 | 3/1989 | Saitoh et al. | 427/69 |
| 4,812,331 | 3/1989 | Hirooka et al. | 427/255.1 |
| 5,308,651 | 5/1994 | Ohta et al. | 427/582 |
| 5,443,033 | 8/1995 | Nishizawa et al. | 117/93 |
| 5,492,860 | 2/1996 | Ohkubo et al. | 117/89 |

FOREIGN PATENT DOCUMENTS

| | | |
|---|---|---|
| 0234094 | 9/1987 | European Pat. Off. . |
| 62-96675 | 5/1987 | Japan . |

*Primary Examiner*—Marianne Padgett
*Attorney, Agent, or Firm*—Fitzpatrick, Cella, Harper & Scinto

[57] ABSTRACT

A process for forming a deposition film comprises introducing a gaseous starting material for forming a deposition film and a gaseous oxidizing agent having an oxidation action on the gaseous starting material separately into a reaction space to chemically contact these two, thereby generating a plurality of precursors including precursor in an excited state, and utilizing at least one of the generated precursors as a supply source for film-constituting members, thereby forming a deposition film on a substrate provided in a film-forming space, the deposition film being formed while supplying a bias energy to the substrate and changing the intensity of the bias energy.

18 Claims, 2 Drawing Sheets

5,624,720

PROCESS FOR FORMING A DEPOSITED FILM BY REACTING BETWEEN A GASEOUS STARTING MATERIAL AND AN OXIDIZING AGENT

This application is a continuation of application Ser. No. 08/094,358, filed Jul. 21, 1993, now abandoned, which was a continuation of application Ser. No. 07/837,685 filed on Feb. 19, 1992, now abandoned, which was a continuation of application Ser. No. 07/501,500, filed on Mar. 30, 1990, now abandoned.

BACKGROUND OF THE INVENTION

1. Field of the Invention

The present invention relates to a process for forming a deposition film useful for semiconductor devices, photosensitive devices for solar batteries and electrophotography, and electronic devices such as optical input sensors for optical image input-output devices.

2. Related Background Art

Heretofore, individually appropriate processes for forming deposition films have been used for forming crystal functional films such as semiconductor films, insulating films, photoconductive films, magnetic films or metal films, based on desired physical properties and applications.

For example, in the formation of silicon crystal deposition films, a thermal CVD method, a hydrogen reduction method, a molecular beam epitaxial method (MBE), a sputtering method, a plasma CVD method, a photo CVD method etc. have been heretofore used.

Among these methods, the thermal CVD method and the hydrogen reduction method have been widely used in the semiconductor industry, but these two methods require so high a deposition temperature that they can fully meet neither a desired lowering of temperature in the semiconductor process nor formation of crystalline deposition films on low melting point substrates such as glass.

The molecular beam epitaxial method (MBE) is capable of forming crystal deposition films at a relatively low temperature. However, but owing to the deposition on substrates by a direct chemical absorption of raw material molecules, the deposition is readily influenced by contamination in the reaction chamber or impurities on the surfaces of substrates. Accordingly, an ultra high vacuum or a clear surface is required for the deposition.

Thus, the MBE method is not always suitable for mass-production from the viewpoint of apparatus cost, maintenance or output.

The plasma CVD method and the photo CVD method have been recently regarded as promising, and have been studied as processes for forming crystal deposition films of high quality at a lower temperature.

However, for example, studies of formation of silicon deposition films by a plasma CVD method or by a photo CVD method, have indicated that, the reaction process is more complicated than that of the conventional CVD method, and its reaction mechanism has not been fully clarified yet.

There are many deposition film formation parameters such as substrate temperature, flow rate of introduced gases and their ratios, pressure in the reaction space during the formation of deposition films, high frequency power, electrode structure for high frequency power input, structure of reaction chamber, venting rate from the reaction chamber, light intensity and wavelength, photoabsorbancy and heat conductivity of the substrate, etc. which are complicatedly interrelated with one another.

Thus, the conditions for forming deposition films sometimes become unstable or at times substantially impossible to carry out the deposition while keeping all the parameters in a state set to the optimum conditions.

Owing to these problems, the plasma CVD method and the photo CVD method are not always satisfactory as a method for forming good crystalline deposition films of large area with a good reproducibility and at a low cost.

On the other hand, another process for forming good crystalline deposition films of large area at a low temperature with a good reproducibility, i.e., a process for forming a crystalline deposition film on a substrate by separately introducing gaseous starting materials for forming a deposition film and a gaseous oxidizing agent into a reaction space and then chemically contacting them, (which will be referred to as chemical deposition process below,) is disclosed in Japanese Patent Application Kokai (Laid-Open) No. 62-96675.

In the above-mentioned process, the reaction to form a deposition film depends substantially on pressures and flow rate ratio of the gaseous starting material and the gaseous oxidizing agent, the substrate temperature, etc.

That is, the process has less restrictions to the controllability of deposition process based on complicated deposition parameters of the conventional process for forming a crystalline deposition film at a low temperature, such as correlations between the flow rates of introduced gases or the pressure in the reaction space and the plasma state, the presence of side reaction by excitation of various chemical species, or correlation between the decomposition of gaseous starting materials by the wavelength or intensity of irradiation light and the reaction on the substrate surface, etc. than in the above-mentioned plasma CVD process. Thus, the chemical deposition process can form a crystalline deposition film of large area with a good uniformity and a good reproducibility.

However, in the above-mentioned chemical deposition process, such a range for conditions, i.e. pressure, flow rate ratio and temperature of a gaseous starting material and a gaseous oxidizing agent, the possibility that the formed deposition film will be in a crystalline form rather than in an amorphous form, is relatively narrow. That is, once a deposition film is formed under the crystallizable condition, the quality of the crystalline deposition film is invariably set. This fact shows that although the chemical deposition process has a good controllability of deposition process by the pressure, flow rate ratios, temperature, etc. of the gaseous starting material and the gaseous oxidizing agent, a crystalline deposition film of required good quality cannot always be obtained within the condition range. Therefore, an improvement of the chemical deposition process by introducing new deposition parameters has been in demand.

SUMMARY OF THE INVENTION

An object of the present invention is to provide an improved chemical deposition process by introducing new deposition parameters to solve the above-mentioned problems.

Another object of the present invention is to provide a process for forming a crystalline deposition film of high quality and good uniformity over a large area at a low temperature.

Further object of the present invention is to provide a process for forming a deposition film which comprises introducing a gaseous starting material for forming a deposition film and a gaseous oxidizing agent having an oxidation action on the gaseous starting material separately into a reaction space to chemically contact these two gases, thereby generating a plurality of precursors including a precursor in an excited state, and utilizing at least one of the generated precursors as a supply source for film-constituting members, thereby forming a deposition film on a substrate provided in a film-forming space, the deposition film being formed while supplying a bias energy to the substrate and varying the intensity of the bias energy.

A further object of the present invention is to provide a process for forming a deposition film which comprises introducing a gaseous starting material for forming a deposition film and a gaseous oxidizing agent having an oxidation action on the gaseous starting material separately into a reaction space to chemically contact these two, thereby generating a plurality of precursors including a precursor in an excited state, and utilizing at least one of the generated precursors as a supply source for film-constituting members, thereby forming a deposition film on a substrate provided in a film-forming space, the deposition film being formed while supplying an energy to the substrate and changing the area on the substrate to be supplied with the energy.

DETAILED DESCRIPTION OF THE PREFERRED EMBODIMENTS

Figure 1:
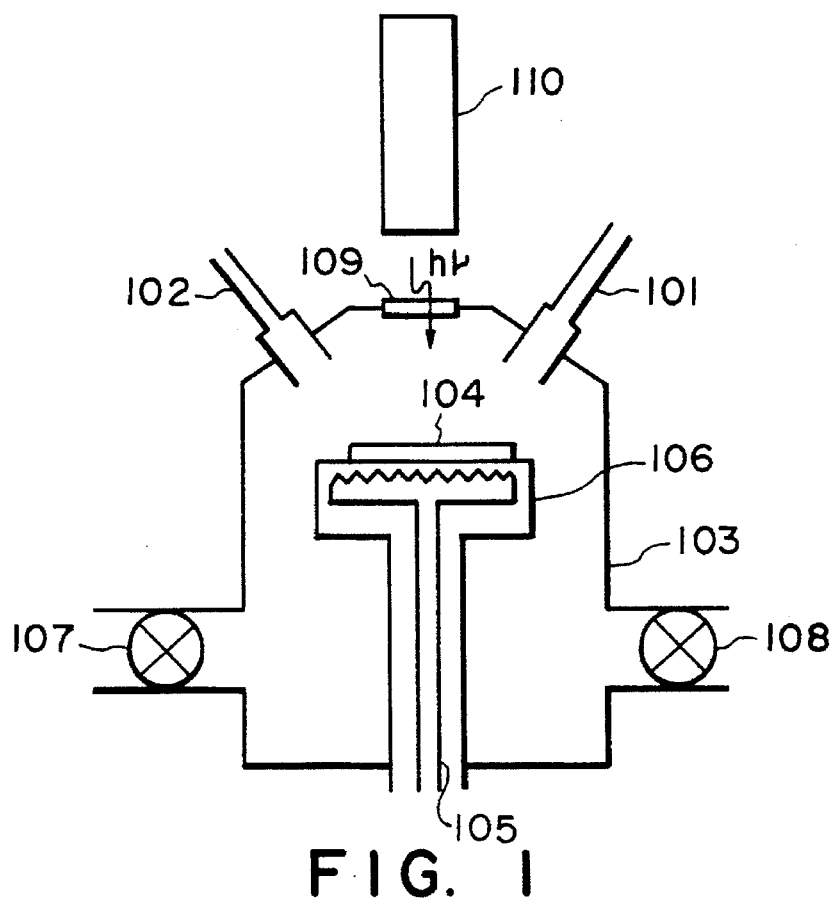
FIG. 1 is a schematic view showing one example of an apparatus for forming a deposition film suitable for the embodiment of the present invention.

In the above-mentioned, conventional chemical deposition process, a range for conditions that will result in the formed deposition film being in a crystalline form rather than in an amorphous form, such as, pressure, flow rate ratio, temperature, etc. of a gaseous starting material and a gaseous oxidizing agent, is relatively narrow. That is, once a deposition film is formed under the crystallizable condition, the quality of the crystalline deposition film is invariable set. In order to obtain a crystalline deposition film of high quality consistently, an improvement of the chemical deposition process by introducing new deposition parameters has been in demand.

As a result of extensive experimental studies on the chemical deposition process in the above-mentioned situations as a background, the present inventors have accomplished the present invention.

The above objects and others are accomplished by providing a process for forming a deposition film which comprises introducing a gaseous starting material for forming a deposition film and a gaseous oxidizing agent having an oxidation action on the gaseous starting material separately into a reaction space to chemically contact these two, thereby generating a plurality of precursors including a precursor in an excited state, and utilizing at least one of the generated precursors as a supply source for film-constituting members, thereby forming a deposition film on a substrate provided in a film-forming space, the deposition film being formed while supplying energy to the substrate and varying the intensity of the energy.

Furthermore, the above objects and others are accomplished by providing a process for forming a deposition film which comprises introducing a gaseous starting material for forming a deposition film and a gaseous oxidizing agent having an oxidation action on the gaseous starting material separately into a reaction space to chemically contact these two, thereby generating a plurality of precursors including a precursor in an excited state and utilizing at least one of the generated precursors as a supply source for film-forming members, thereby forming a deposition film on a substrate provided in a film-forming space, the deposition film being formed while supplying an energy to the substrate and changing the area on the substrate to be supplied with the energy.

According to the present process for forming a deposition film, a compact crystalline deposition film of large grain size can be uniformly formed over a larger area at a low temperature with less defects. Furthermore, a reduction in apparatus cost and film-forming cost due to the lower film-forming temperature, as well as an increase in the yield of a uniform crystalline deposition film of high quality over a large area and simplification of maintenance can be attained.

The principle of the present invention will be explained below, referring to a case using $SiH_4$ as a gaseous starting material and $F_2$ as a gaseous oxidizing agent as a preferable example.

FIG. 1 is a schematic view showing a preferable example of an apparatus for forming a deposition film suitable for the embodiment of the present invention, where an inlet pipe 101 is provided for introducing a gaseous starting material ($SiH_4$) to a reactor chamber 103 and an inlet pipe 102 is provided for introducing a gaseous oxidizing agent ($F_2$) to the reactor chamber 103. The inlet pipes are not restricted to those shown in FIG. 1. Multiple concentric tubular conduits such as a double concentric pipe, a triple concentric pipe, etc. can be used as the inlet pipe, or gases may be introduced through spaces between the concentrically provided pipes. A substrate 104 is set to a support 106 including a heater 105 for heating the substrate 104. Before the formation of a deposition film, the reaction chamber 103 is evacuated to a predetermined background pressure by a vacuum pump 107. During the formation of a deposition film, the gaseous starting material and the gaseous oxidizing agent are evacuated at a predetermined rate by another vacuum pump 108. A window 109 is provided for irradiation of the substrate 104 with a light energy from a light source 110.

The apparatus for forming a deposition film used for the embodiment of the present process for forming a deposition film is not restricted to the apparatus shown in FIG. 1. Any other apparatus can be used so long as it is provided with a means for separately introducing a gaseous starting material and a gaseous oxidizing agent to a reaction chamber, a support for a substrate, which includes a heater for heating the substrate is provided in the reaction chamber, and a means for applying energy to the substrate and can attain the objects of the present invention.

Figure 2:
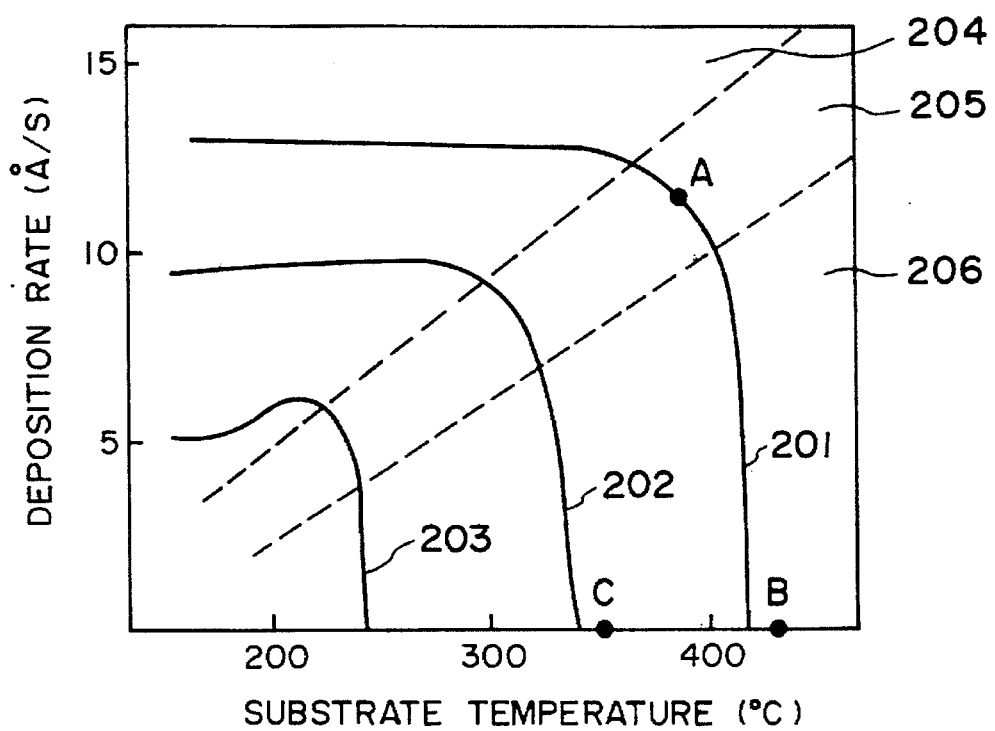
FIG. 2 is a diagram showing a relationship between a deposition rate of a deposition film and a substrate temperature by a chemical deposition process.

FIG. 2 is a diagram showing a result of deposition tests of crystalline deposition film by a chemical deposition process in the apparatus shown in FIG. 1, where the curves show relationships between a substrate temperature and a deposition rate with respect to flow rate ratios of $SiH_4$ to $F_2$.

Curve 201 shows a case of $SiH_4/F_2=1/1$, curve 202 a case of $SiH_4/F_2=2/3$ and curve 203 a case of $SiH_4/F_2=1/2$, where the total pressure prevailing in the reaction chamber during the formation of deposition films was 500 m Torr. Glass #7059, made by Corning Glass Works, USA was used for the substrate 104. In FIG. 2, an area 204 shows a condition range for forming an amorphous silicon film, an area 205 a condition range for forming a crystalline silicon film, and an area 206 a condition range for forming no deposition film at all due to an etching action. The structural form of the thus formed deposition films was determined by X-ray diffraction. As is clear from FIG. 2, crystallization of the formed deposition films take place in the condition range very near the etching action-dominant area 206 in all the cases of curves 201 to 203, and the crystallization temperature increases with increasing flow rate ratio of $SiH_4/F_2$. This shows that a plurality of precursors including $SiF_nH_m$, a precursor for forming a deposition film, are formed by reaction of a gaseous starting material $SiH_4$ with a gaseous oxidizing agent $F_2$, and crystallization takes place only under such a condition that the action to deposit a silicon film on the substrate in the film-forming space by the precursors and an etching action by $F_2$ as an oxidizing agent are balanced. The higher the substrate temperature, the larger the grain size of the resulting crystal grain. For example, under the condition of point A on the curve 201, it was observed by a transmission type electron microscope that the grain size was about 600 nm. In order to obtain a crystalline deposition film of much larger grain size by the above-mentioned conventional chemical deposition process, it is necessary not only to increase the substrate temperature, but also to lower a flow rate ratio of $SiH_4/F_2$ and lower the reaction pressure during the deposition, because the film-forming rate can be lowered by lowering the flow rate ratio of $SiH_4/F_2$ and the reaction pressure. In the case of a lower film-forming rate the number of formed nuclei of crystals is decreased, as compared with the case of a higher film-forming rate where consequently the grain size of grown crystals becomes larger.

However, an increase in the substrate temperature deviate from the proper object of the chemical deposition process, i.e., formation of a crystalline film at a lower temperature, and a decrease in the reaction pressure during the formation of a deposition film leads not only to a decrease in the deposition rate of the crystalline film, but also to a relative increase in partial pressures of impurity gases in the total reaction pressure resulting in the inclusion of a greater quantity of impurities into the crystalline film.

The present invention has been accomplished in view of these situations and can form a crystalline deposition film of larger grain size with less impurities at a lower substrate temperature by a chemical deposition process.

In the present invention, a deposition film is formed by changing the intensity of an energy supplied to a substrate provided in the film-forming space or by changing the area on the substrate to be supplied with the energy. That is, the deposition film can be formed by changing the film-forming conditions, thereby controlling a balance between the etching of the deposition film and the formation of the deposition film, and thus a crystalline deposition film having a distinguished crystal orientation, where the less etching-susceptive crystal face in a specific direction preferentially grows, can be formed.

In the present invention, the substrate temperature can be elevated or lowered by varying the intensity of energy to be supplied to the substrate. As is obvious from FIG. 2, deposition of a crystalline film predominantly proceeds in a low substrate temperature phase (point A in FIG. 2), whereas etching of the deposition film takes place in a high substrate temperature phase (point B in FIG. 2). Under the condition of point B in FIG. 2, the deposition film is not uniformly etched. However, portions of amorphous phases or crystal phases with many defects, or crystal grains with a readily etchable orientation are removed by etching at a relatively high speed.

Thus, by repeatedly elevating and lowering the substrate temperature, a crystalline deposition film of high quality freed from the amorphous phases or crystal phases with many defects can be formed. At the same time, a balance between the deposition and the etching can be readily controlled by changing an application pattern of energy, and thus a crystalline deposition film of larger grain size with less etching-susceptible crystal face preferentially grown in a specific direction can be formed by properly selecting the energy application condition.

Furthermore, in the present invention the above-mentioned effect can also be obtained by changing the area on the substrate to be supplied with energy, because the temperature in a specific area on the substrate surface can be varied by changing the area on the substrate surface to be supplied with energy.

Another process for forming a cyrstalline deposition film of higher quality according to the present invention will be explained below.

In the another process of the present invention, the temperature of substrate 104 is syncronized with periodically changing application of external energy and the flow rate ratio of gaseous oxidizing agent/gaseous starting material is also increased or decreased. In a phase of a higher substrate temperature and a lower flow rate ratio of gaseous oxidizing agent/gaseous starting material, the deposition of a crystalline film predominantly proceeds (point A in FIG. 2), whereas in a phase of a lower substrate temperature and a higher flow rate ratio of gaseous oxidizing agent/gaseous starting material, etching of the deposition film predominantly proceeds (point C in FIG. 2). In the another process, where the substrate temperature is high resulting in the phase of predominant deposition of a crystalline film (point A in FIG. 2) crystals of high quality with less defects are liable to grow, whereas in the phase of predominant etching (point C in FIG. 2), where the substrate temperature is low, the etching reaction proceeds mildly and thus damages on the crystalline film are less. Thus, a crystalline film of higher quality can be formed in another process of the present invention.

Since no plasma is generated in the reaction space for forming a crystalline film by the present process for forming a deposition film, the film is less susceptible to damages due to ions or radicals excited to a higher energy level, and thus it is needless to say from this point of view that a crystalline film of high quality can be formed.

The gaseous starting material for use in the present process for forming a crystalline deposition film contains an element constituting the crystalline film to be deposited and is subjected to an oxidation action through a chemical contact with the gaseous oxidizing agent and is appropriately selected in view of the speed, characteristics and applications of a desired deposition film. For example, in the case of forming a silicon crystalline film or a germanium crystalline film, straight or branched chain silane compounds, cyclic silane compounds, chain germanium compounds, etc. can be used. More specifically, the straight chain silane compounds include those represented by the general formula:

$Si_nH_{2n+2}$, where n is an integer of 1 to 8; branched chain silane compounds include $SiH_3SiH(SiH_3)SiH_2SiH_3$; the chain germanium compounds include those represented by the general formula:

$$Ge_mH_{2m+2},$$

where m is an integer of 1 to 5. These starting materials can be used above or in combination of at least two thereof.

The gaseous oxidizing agent for use in the present process for forming a crystalline deposition film is gasified when introduced into the reaction space and has an effective oxidation action on the gaseous starting material for forming the deposition film to be introduced into the reaction space at the same time only by chemical contact, and includes, for example, halogens such as $F_2$, $Cl_2$, gasified $Br_2$ and $I_2$, etc., halogenated carbons such as $CF_4$, $C_2F_6$, $CCl_4$, $CBrF_3$, $CCl_2F_2$, $CCl_3F$, $CClF_3$, $C_2Cl_2F_4$, etc., halogenated borons such as $BCl_3$, $BF_3$, etc. and other halides such as $SF_5$, $NF_3$, $PF_5$, etc., and radicals of these gases, such as $F^*$, $Cl^*$, etc. and ions of these gases such as $CF_3^+$, $CCl_3^+$, etc. These gases can be used alone or in combinations thereof, and other gases such as $O_2$, $H_2$, etc. can be added thereto to such an extent as not to give any influence on the film.

In order to control the reaction between the gaseous starting material and the gaseous oxidizing agent, both or either of the gaseous starting material and the gaseous oxidizing agent can be diluted with such a gas as Ar, He, $N_2$, $H_2$, etc.

A means of applying energy in the present process for forming a deposition film includes a halogen lamp, a laser, etc. as a photo energy, where a light beam having a relative long wavelength and such an energy level as not to intensively generated a plasma in the film-forming space by the irradiation, but to increase the substrate temperature is used and the wavelength of light beam for the irradiation is preferably 0.2 to 20 μm, and also includes heater heating, infrared heating, etc. as a surge of heat energy. In the present invention, the energy can be also supplied through a support that supports the substrate, where, for example, a plurality of heaters are provided in the support and the individual heaters are independently controlled to "on" or "off" to change the area on the substrate to be supplied with the energy.

A means for periodic modulation of energy intensity includes modulation of intensity of energy source itself, or modulation by a chopper or an electrooptical device or an acoustic-optical device, etc.

An optimum modulation of energy intensity is determined in view of the deposition rate, species of oxidizing agent, light intensity and wavelength, photo absorbancy and heat capacity of a substrate etc., and a preferable modulation of energy intensity is such as to make a change in the substrate surface temperature fall in a range of 10° to 80° C.

Figure 3A:
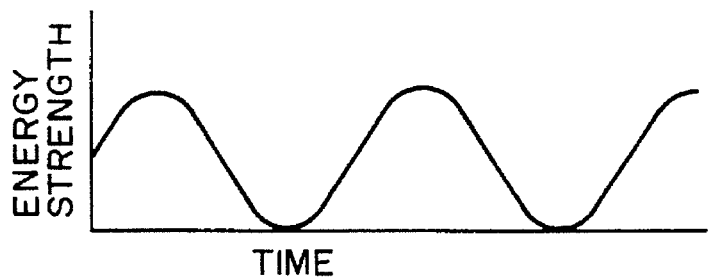
FIGS. 3A, 3B, 3C, 3D and 3E are diagrams showing modulation patterns of energy supplied to a film-forming space in the present invention.
Figure 3B:
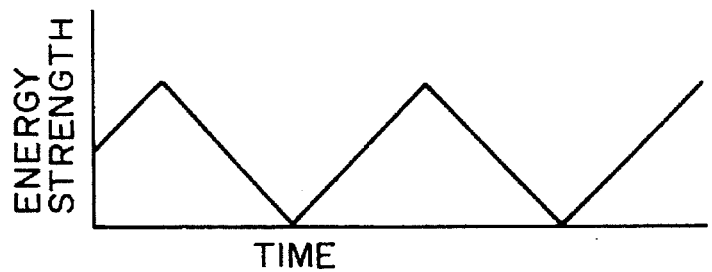
Figure 3C:
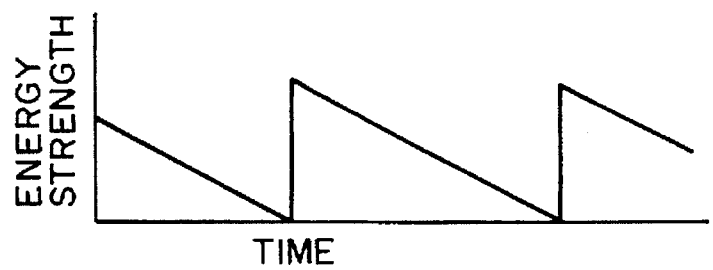
Figure 3D:
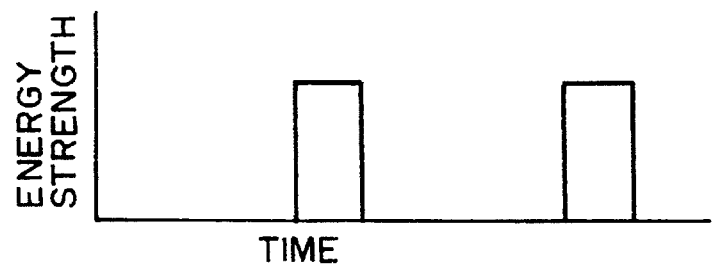
Figure 3E:
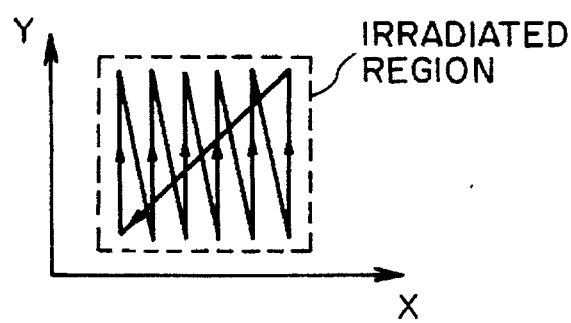

The modulation pattern includes, for example, a sine wave pattern shown in FIG. 3A, a triangular shape pattern shown in FIG. 3B, a saw teeth shape pattern as shown in FIG. 3C and a pulse wave pattern as shown in FIG. 3D, or when an energy is applied to the parts on a broad substrate by a narrow beam, raster scanning can be carried out, as shown in FIG. 3E. When the energy is applied in a pulse wave form, it is needless to say that the duty can be changed, if required.

When a crystalline film is deposited with a photo energy in the deposition by the present process, the deposition rate is lowered only by increasing the light intensity, and thus the step of accelerating the deposition by light energy as in the ordinary photo CVD process is not substantially predominant. In the present invention, the irradiating photo energy does not act to promote the formation of a deposition film. Furthermore, a decrease in the deposition rate takes place even if the light wavelength is longer than that of the visible light. Thus, it is not due to the direct photo etching, thereby showing that the etching effect of chemical deposition process is promoted basically by an increase in the substrate temperature.

[EXAMPLES]

The present invention will be explained in detail below, referring to Examples.

Example 1

A polycrystalline silicon film was formed in an apparatus for forming a deposition film as shown in FIG. 1. That is, a polycrystalline silicon film was formed on a glass substrate 104 (#7059, trademark of a product made by Corning Glass Works) by introducing $SiH_4$ gas through an inlet pipe 101 and $F_2$ gas diluted with a He gas to 10% through an inlet pipe 102 into a reaction chamber 103 under a total pressure of 500 mTorr during the formation of deposition film. The flow rate of the $SiH_4$ gas was in a range of 15 to 30 sccm and that of the $F_2$ gas was 30 sccm. As a source of energy, an Ar gas laser beam of maximum output of 6 W with continuous oscillation was used. Specifically, the laser beam was focussed to a spot, about 1 mm in diameter on the glass substrate and subjected to raster scanning in an area, 3 cm×2 cm, on the glass substrate by an optical system based on a pair of galvano mirrors, where the repeating frequency of raster scanning was 1 Hz. At that time, the substrate temperatures were 250° C., 300° C. and 400° C. without laser beam irradiation and when the substrate was irradiated with the laser beam under the above-mentioned conditions, the temperature in specific five regions in the substrate was elevated and lowered with a period of 1 Hz, and the peak value was higher by about 40° to 80° C. than that without the laser beam irradiation. The measurement of temperatures on the substrate was carried out with a plurality of thermocouples, 0.2 mm in diameter, embedded in the glass substrate.

The deposition was continued under the above-mentioned conditions for about 10 to 20 minutes, whereby a polycrystalline film having an average film thickness of about 1.2 μm was obtained (Sample A).

Besides the sample A prepared under the above-mentioned conditions, two samples were prepared for comparison at the same time. A first comparative sample (Sample B) was prepared under the same conditions as in the case of Sample A except that laser beam irradiation was not effected and that the film-forming time was adjusted. That is, the film-forming time was adjusted so as to make an average film thickness of about 1.2 μm. A second comparative sample (Sample C) was prepared under the same condition as in the case of Sample A except that the laser beam was subjected to a high speed raster scanning of 100 Hz or more and the temperature of the entire substrate was constantly maintained at a temperature higher by about 40° to 80° C. than the temperature without the laser beam irradiation.

Results of determining the average grain size of these sampler by the peak on (111) plane by X-ray diffraction are shown in Table 1. As is obvious from Table 1, a polycrystalline silicon film of larger grain size can be formed by irradiation of the substrate with a laser beam of periodically modulated intensity in the chemical deposition process, and no deposition of film is obtained in Sample C. It is seen from this fact that it is important to periodically modulate the intensity of laser beam.

Example 2

A polycrystalline silicon thin film was formed in an apparatus for forming a deposition film as shown in FIG. 1 in the same manner as in Example 1. That is, a polycrystalline silicon film was formed on a glass substrate 104 (#7059, trademark of a product by Corning Glass Works) with an area of 15 cm×15 cm under a total pressure of about 500 m Torr during the formation of the deposition film by introducing $SiH_4$ gas through an inlet pipe 101 and $F_2$ gas diluted with He gas to 10% into a reaction chamber 103, where the flow rate of the $F_2$ gas was 30 sccm. The substrate was irradiated with energy by switching a halogen lamp beam to "on" or "off" by a chopper at a period of about 2 seconds. The irradiation energy of the halogen lamp used had an energy irradiation density of 1 $W/cm^2$ on average on the substrate surface. The substrate temperature without irradiation with the halogen lamp light was about 250° C. and the substrate temperature with the irradiation was about 300° C. At the time, the flow rate of the $SiH_4$ gas was 20 sccm, and an actual flow rate of the $F_2$ gas was changed to about 50 sccm when not irradiated with the halogen lamp light and to about 30 sccm when irradiated in a synchronized manner. Temperature determination of the substrate was carried out with thermocouples in the same manner as in Example 1. When the deposition was continued for about 10 minutes under the above-mentioned conditions, a polycrystalline deposition film having an average film thickness of about 0.5 μm was obtained (Sample D).

The average grain sizes of these samples were determined by the peak on (111) plane by X-ray diffraction. Furthermore, etching rates of these samples were determined in an etching solution, which was a mixture of 49% fluoric acid solution, a 70% nitric acid solution and 90% acetic acid solution in a mixing ratio of 1:25:25. The results are shown in Table 2 together with results of Sample A at a substrate temperature of 250° C. and Sample B at a substrate temperature of 300° C.

As is obvious from the results of etching rates shown in Table 2, the crystalline film according to Example 1 of the present invention (Sample A) is more compact, exhibits less defects and is higher in quality than the crystalline film prepared by the conventional chemical deposition process (Sample B), and furthermore the crystalline film according to Example 2 of the present invention (Sample D) is much more compact, exhibits less defects and is much higher in quality than the crystalline film according to Example 1 of the present invention (Sample A). The results of etching rates reveal that the quality of crystalline film of Sample D is uniform throughout the entire substrate surface.

It is evident from the foregoing detailed explanation and Examples that a compact crystalline thin film of larger grain size with less defects can be uniformly formed over a larger area at a low temperature such as about 200° to about 400° C. according to the present process for forming a crystalline deposition film.

TABLE 1

| Substrate temp. | $SiH_4$ flow rate | Sample A | Sample B | Sample C |
| --- | --- | --- | --- | --- |
| 250° C. | 15 sccm | 0.06 | 0.02 | no deposition |
| 300° C. | 20 sccm | 0.20 | 0.03 | no deposition |
| 400° C. | 30 sccm | 0.30 | 0.06 | no deposition |

Unit of average grain size: μm.

TABLE 2

| | Sample A | Sample B | Sample D |
| --- | --- | --- | --- |
| Average grain size (μm) | 0.15 | 0.02 | 0.20 |
| Etching rate (Å/min) | 0.10 | 0.30 | 0.05 |

Deposition temperature: up to 300° C.

What is claimed is:

1. A process for forming a crystalline deposited film on a substrate in a reaction space which comprises: (i) separately introducing at measurable flow rates a first flow of a gaseous starting material for forming the deposited film, said gaseous starting material being a gas of a single tetrahedral-based compound, or a gas mixture of more than one of said tetrahedral-based compound, or each of said gas of said single tetrahedral-based compound or said gas mixture of more than one of said tetrahedral-based compound additionally containing a doping element, and a second flow of a gaseous oxidizing agent, capable of having an oxidation action on the gaseous starting material, into said reaction space, wherein said gaseous oxidizing agent is a halogen compound, (ii) chemically contacting said gaseous starting material and said oxidizing agent, thereby generating a plurality of precursors including a precursor in an excited state, and (iii) utilizing at least one of the generated precursors as a supply source of film-constitution member, (iv) supplying to said substrate a level of energy sufficient to create a 10° C. to 80° C. increase in a temperature of the substrate surface by varying the level of the energy supplied to said substrate to increase said substrate temperature such that said substrate temperature is synchronized with a flow ratio of the gaseous oxidizing agent to the gaseous starting material wherein said synchronization is achieved by adjusting the substrate temperature and the flow ratio so that when the temperature of the substrate surface increases, the flow ratio of the gaseous oxidizing agent to the gaseous starting material is decreased, and when the temperature of the substrate surface decreases, said flow ratio increases, thereby controlling deposition action during the forming of a deposited film on said substrate, and to impart a non-uniform temperature distribution on said substrate surface, where deposition takes place, thereby forming the crystalline deposited film on said substrate in said reaction space.

2. A process according to claim 1, wherein said energy is a photo energy.

3. A process according to claim 1, wherein the gas of tetrahedral-based compound is a chain silane compound.

4. A process according to claim 3, wherein the chain silane compound is represented by the general formula:

$$Si_nH_{2n+2}$$

where n is an integer of 1 to 8.

5. A process according to claim 1, wherein the halogen compound is a fluorine compound.

6. A process according to claim 5, wherein the fluorine compound is a fluorine gas.

7. A process according to claim 1, wherein a part or the whole of the substrate surface on which the deposited film is formed is composed of an amorphous material.

8. A process according to claim 1, wherein said energy supplied to the substrate is periodically changed.

9. A process according to claim 1, wherein said energy is supplied through a support that supports the substrate.

10. A process for forming a crystalline deposited film on a substrate in a reaction space which comprises: (i) separately introducing at measurable flow rates a first flow of a gaseous starting material for forming the deposited film, said gaseous starting material being a gas of a single tetrahedral-based compound, or a gas mixture of more than one of said tetrahedral-based compound, or each of said gas of said single tetrahedral-based compound or said gas mixture of more than one of said tetrahedral-based compound additionally containing a doping element, and a second flow of a gaseous oxidizing agent, capable of having an oxidation action on the gaseous starting material, into said reaction space wherein said gaseous oxidizing agent is a halogen compound, (ii) chemically contacting said gaseous starting material and said oxidizing agent, thereby generating a plurality of precursors including a precursor in an excited state, and (iii) utilizing at least one of the generated precursors as a supply source of film-constituting members, (iv) supplying to an area of said substrate a level of energy sufficient to create a 10° C. to 80° C. increase in a temperature of the substrate surface by varying the level of the energy supplied to said substrate to increase said substrate temperature such that said substrate temperature is synchronized with a flow ratio of the gaseous oxidizing agent to the gaseous starting material wherein said synchronization is achieved by adjusting the substrate temperature and the flow ratio so that when the temperature of the substrate surface increases, the flow ratio of the gaseous oxidizing agent to the gaseous starting material is decreased, and when the temperature of the substrate surface decreases, said flow ratio increases, thereby controlling deposition action during the forming of a deposited film on said substrate and to impart a non-uniform temperature distribution on said substrate surface, where deposition takes place and (v) changing the area on said substrate to which said energy is applied, thereby forming the crystalline deposited film on said substrate in said reaction space.

11. A process according to claim 10, wherein the temperature of a region on the substrate surface is changed by changing the area to be supplied with said energy on the substrate.

12. A process according to claim 10, wherein said energy is a photo energy.

13. A process according to claim 10, wherein the tetrahedral-based compound is a chain silane compound.

14. A process according to claim 13, wherein the chain silane compound is represented by the general formula:

$$Si_nH_{2n+2}$$

where n is an integer of 1 to 8.

15. A process according to claim 10, wherein the halogen compound is a fluorine compound.

16. A process according to claim 15, wherein the fluorine compound is a fluorine gas.

17. A process according to claim 10, wherein a part or the whole of the substrate surface on which the deposited film is formed is composed of an amorphous material.

18. A process according to claim 10, wherein said energy is supplied through a support that supports the substrate.

* * * * *

UNITED STATES PATENT AND TRADEMARK OFFICE
CERTIFICATE OF CORRECTION

PATENT NO. : 5,624,720

DATED : April 29, 1997

INVENTORS : YOSHIYUKI OSADA, ET AL.

It is certified that error appears in the above-identified patent and that said Letters Patent is hereby corrected as shown below:

COLUMN 2
  Line 26, "less" should read --fewer--;
  Line 66, "Further" should read --A further--.

COLUMN 4
  Line 20, "less" should read --fewer--.

COLUMN 6
  Line 26 "the" (1st occurrence) should be deleted.

COLUMN 8
  Line 60, "sampler" should read --samples--.

COLUMN 9
  Line 41, "less" should read --fewer--;
  Line 46, "less" should read --fewer--;
  Line 53, "less" should read --fewer--.

Signed and Sealed this

Twenty-fourth Day of March, 1998

Attest:

BRUCE LEHMAN

*Attesting Officer*     *Commissioner of Patents and Trademarks*

UNITED STATES PATENT AND TRADEMARK OFFICE
CERTIFICATE OF CORRECTION

PATENT NO. : 5,624,720
DATED : April 29, 1997
INVENTOR(S) : YOSHIYUKI OSADA, ET AL.

It is certified that error appears in the above-identified patent and that said Letters Patent is hereby corrected as shown below:

COLUMN 10

Line 17, "of said" should be deleted.
Line 20, "of said" should be deleted.

COLUMN 11

Line 6, "of said" should be deleted.
Line 9, "of said" should be deleted.

Signed and Sealed this

Twelfth Day of May, 1998

Attest:

BRUCE LEHMAN

*Attesting Officer*        *Commissioner of Patents and Trademarks*